(12) United States Patent
Joish et al.

(10) Patent No.: US 10,419,010 B1
(45) Date of Patent: Sep. 17, 2019

(54) PIPELINED ANALOG-TO-DIGITAL CONVERTER

(71) Applicant: TEXAS INSTRUMENTS INCORPORATED, Dallas, TX (US)

(72) Inventors: Rajendrakumar Joish, Bengaluru (IN); Himanshu Varshney, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/217,165

(22) Filed: Dec. 12, 2018

(51) Int. Cl.
*H03M 1/06* (2006.01)
*H03K 3/037* (2006.01)
*H03M 1/36* (2006.01)

(52) U.S. Cl.
CPC .......... *H03M 1/0614* (2013.01); *H03K 3/037* (2013.01); *H03M 1/363* (2013.01)

(58) Field of Classification Search
CPC ....... H03M 1/0614; H03M 1/36; H03K 3/037
USPC ................................................ 341/118, 155
See application file for complete search history.

(56) References Cited

U.S. PATENT DOCUMENTS

| | | | | |
|---|---|---|---|---|
| 4,489,309 A | * | 12/1984 | Schlig | H03M 1/38 257/239 |
| 5,583,713 A | * | 12/1996 | Real | G16H 50/30 360/77.08 |
| 6,987,477 B1 | * | 1/2006 | Aude | H03M 1/0695 341/155 |
| 7,551,114 B2 | * | 6/2009 | Joy | H03M 1/002 341/122 |

* cited by examiner

*Primary Examiner* — Brian K Young
(74) *Attorney, Agent, or Firm* — John R. Pessetto; Charles A. Brill; Frank D. Cimino

(57) ABSTRACT

Pipelined analog-to-digital converters (ADCs) include a flash ADC that reduces noise tones in power supply current drawn by the flash ADC. A pipelined analog-to-digital converter (ADC) includes a flash ADC and error correction circuitry coupled to the flash ADC. The flash ADC includes a plurality of latched comparators and a plurality of driver circuits. Each of the latched comparators includes an inverting output and a non-inverting output. Each of the driver circuits is coupled to one of the latched comparators, and includes an input terminal and an output terminal. In a first subset of the driver circuits the input terminal is coupled to the inverting output of one of the latched comparators. In a second subset of the driver circuits the input terminal is coupled to the non-inverting output of one of the latched comparators.

20 Claims, 5 Drawing Sheets

PIPELINED ANALOG-TO-DIGITAL CONVERTER

BACKGROUND

Flash analog-to-digital converters (ADCs) are circuits that compare the magnitude (e.g., voltage) of an input signal against multiple threshold levels, and provide multiple output bits, with each output bit indicating a comparison result. Each output bit is generally of one binary value when the corresponding threshold level is less than the input voltage and of the other binary value otherwise. The output bits together represent a digital code corresponding to the magnitude of the input signal and can be encoded as a multi-bit binary value. Rash ADC are often used in applications that require high digitization rate, such as direct sampling radio frequency receivers.

SUMMARY

Pipelined analog-to-digital converters (ADCs) including a flash ADC that reduces noise tones in power supply current drawn by the flash ADC are disclosed herein. In one example, a pipelined ADC includes a flash ADC and error correction circuitry coupled to the flash ADC. The flash ADC includes a plurality of latched comparators and a plurality of driver circuits. Each of the latched comparators includes an inverting output and a non-inverting output. Each of the driver circuits is coupled to one of the latched comparators, and includes an input terminal and an output terminal. In a first subset of the driver circuits, the input terminal is coupled to the inverting output of one of the latched comparators. In a second subset of the driver circuits, the input terminal is coupled to the non-inverting output of one of the latched comparators.

In another example, a system includes front end circuitry, a sampling switch, a sampling capacitor, a flash ADC, a digital-to-analog converter (DAC), and a residue amplifier. The sampling switch is coupled to the front end circuitry. The sampling capacitor is coupled to the sampling switch. The flash ADC is coupled to the sampling capacitor, and includes a first plurality of latched comparators and a second plurality latched comparators. Each latched comparator of the first plurality of latched comparators is configured to compare a voltage on the sampling capacitor to a threshold voltage that is within a range of voltage digitizable by the flash ADC. Each latched comparator of the second plurality of latched comparators is configured to compare the voltage on the sampling capacitor to a threshold voltage that is higher than an upper limit of voltage digitizable by the flash ADC. The DAC is coupled to the flash ADC, and is configured to generate a voltage representative of output of the first plurality of latched comparators. The residue amplifier is coupled to the sampling capacitor and the DAC, and is configured to generate a residue voltage that is a difference of the voltage on the sampling capacitor and the voltage representative of output of the first plurality of latched comparators.

In a further example, a pipelined ADC includes a flash ADC, a plurality of flip-flops, and error correction circuitry. The plurality of flip-flops is coupled to the flash ADC. The error correction circuitry is coupled to outputs of the plurality of flip-flops. The flash ADC includes a plurality of reference voltage sources, a plurality of latched comparators, a first plurality of driver circuits, and a second plurality of driver circuits. Each of the reference voltage sources is configured to generate a different threshold voltage. Each of the latched comparators is configured to compare a sample voltage to a threshold voltage provided by one of the reference voltage sources. The threshold voltage provided to each of the latched comparators is different, and is within a range of voltage digitizable by the flash ADC. In sequence of highest to lowest threshold voltage, each successive one of the latched comparators is configured to provide an output signal to a different one of the first subset of the driver circuits and the second subset of the driver circuits. Each driver circuit of the first plurality of driver circuits is coupled to an inverting output of one of the latched comparators. Each driver circuit of the second plurality of driver circuits is coupled to a non-inverting output of one of the latched comparators. The plurality of flip-flops is configured to store signal received from the first plurality of driver circuits and the second plurality of driver circuits. The error correction circuitry is configured to generate a digital value representing the sample voltage based on signals received from the flip-flops.

BRIEF DESCRIPTION OF THE DRAWINGS

For a detailed description of various examples, reference will now be made to the accompanying drawings in which.

DETAILED DESCRIPTION

Figure 1:
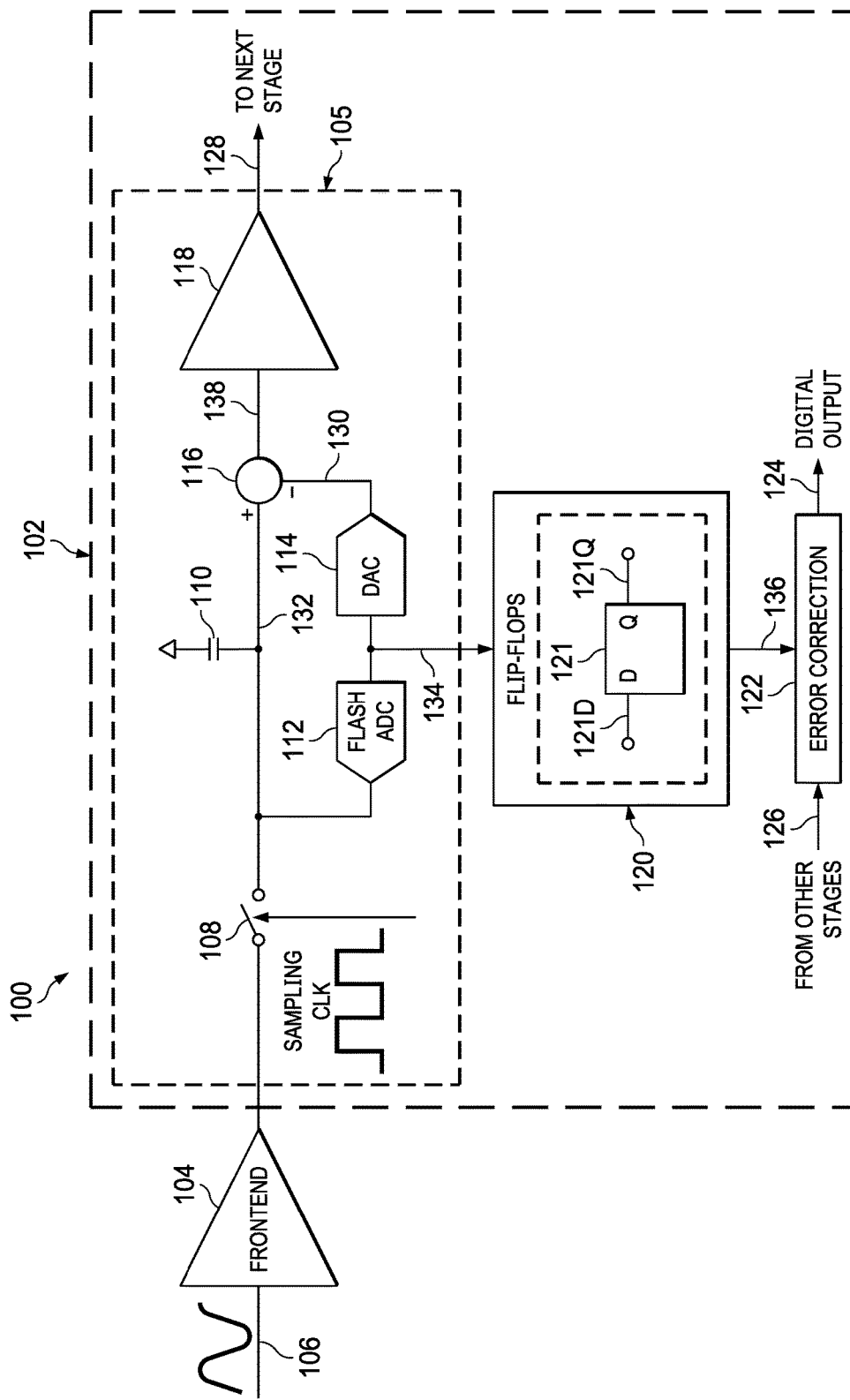
FIG. 1 shows a block diagram for an example system that includes a pipelined analog-to-digital converter (ADC) in accordance with the present disclosure.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Flash analog-to-digital converters (ADCs) include numerous internal circuits that switch based on the magnitude of the input signal being digitized. As a result, the power supply current drawn by the flash ADC is a function of the input signal, and harmonics related to the input signal are imposed on the power supply current drawn by the flash ADC. The harmonics can be coupled to other circuits through a system's power network (e.g., through ground or power supply voltage connections), and degrade the performance of the system. Some systems employing a flash ADC add a dummy load to the flash ADC power supply to cancel these harmonics. The dummy load is sized equally to the flash ADC, and therefore requires the same circuit area and consumes the same power as the flash ADC, which is undesirable. Such implementations cancel odd harmonics but do not cancel even harmonics.

The pipelined ADCs disclosed herein include a flash ADC and associated circuitry that reduce odd and even harmonics induced in power supply current by operation of the flash ADC. In implementations of the pipelined ADC, the flash ADC includes, in addition to the comparators that identify the magnitude of the input signal, comparators that compare the input signal to threshold voltages beyond the highest positive and negative signal magnitudes identifiable by the flash ADC. These comparators flatten the current profile of the flash ADC.

Additionally, rather than latching the comparator output states and then routing the latched signals to error correction circuitry, the flash ADC comparator outputs are first routed and then latched in flip-flops disposed at the boundary of the error correction circuitry that combines the outputs of the multiple digitization stages of the pipelined ADC. Thus, the flash ADC transmissions include both reset and latching phases of conversion. Moreover, given a sequence of comparators that apply increasing threshold voltages, the flash ADC for each successive comparator transmits comparator output of opposite polarity from the polarity transmitted for the next lower or next higher threshold. That is, the flash ADC alternates transmission of inverting and non-inverting outputs of the comparators. These changes to flash ADC data transmission substantially reduce the magnitude of harmonic components induced in the power supply current.

FIG. 1 shows a block diagram for an example system 100 that includes a pipelined ADC in accordance with the present disclosure. In one implementation, the system 100 is a direct sampling radio frequency receiver. The system 100 includes a pipelined ADC 102 and front end circuitry 104 coupled to the pipelined ADC 102. The system 100 includes various other subsystems that have been omitted from FIG. 1 in the interest of clarity. For example, the system 100 includes power supplies that power the pipelined ADC 102 and the front end circuitry 104.

The front end circuitry 104 receives an input signal s106, and conditions the input signal 106 for digitization. For example, an implementation of the front end circuitry 104 includes amplifiers to drive the input signal 106 to the pipelined ADC 102, filters to limit the bandwidth of the input signal 106 for digitization, etc. The front end circuitry 104 provides the conditioned input signal 106 to the pipelined ADC 102.

The pipelined ADC 102 includes multiple analog-to-digital conversion stages. In FIG. 1, a conversion stage 105 is shown. Additional conversion stages, that are similar to the conversion stage 105 have been omitted from FIG. 1 in the interest of clarity. The pipelined ADC 102 also includes error correction circuitry 122 that combines the outputs of the multiple conversion stages to produce a digital output 124. The output of each stage of the pipelined ADC 102 is provided to the error correction circuitry 122 via the flip-flops 120.

The conversion stage 105 includes a sampling switch 108, a sampling capacitor 110 coupled to the sampling switch 108, a flash ADC 112 coupled to the sampling capacitor 110, a digital-to-analog converter (DAC) 114 coupled to the flash ADC 112, differencing circuitry 116, and a residue amplifier 118. The sampling switch 108 closes to charge the sampling capacitor 110 to the voltage at the output of the front end circuitry 104, and opens to hold the voltage on the sampling capacitor 110 for digitization. The opening and closing of the sampling switch 108 is controlled by sampling clock that defines the sample and hold times for the conversion stage 105.

The flash ADC 112 includes a plurality of comparators that, while the sampling switch 108 is open, compare the voltage on the sampling capacitor 110 to a plurality of threshold voltages. That is, each of the comparators compares the voltage on the sampling capacitor 110 to a different threshold voltage. The cumulative outputs of the comparators represent the voltage on the sampling capacitor 110 quantized to the threshold voltages. The outputs of the comparators are provided to the DAC 114. If operation of the flash ADC 112 induces harmonics in the power supply current drawn by the flash ADC, the harmonics may be coupled to the front end circuitry 104, or other circuits of the system 100, through power connections of the system 100, and degrade the performance of the system 100. In the pipelined ADC 102, the flash ADC 112 includes circuitry configured to reduce the magnitude of harmonics in the power supply current.

The DAC 114 converts the outputs of the comparators of the flash ADC 112 into a voltage representing the voltage on the sampling capacitor 110 as quantized by the flash ADC 112. An implementation of the DAC 114 selects one of the threshold voltages to output based on the comparator output signals 134 received from the flash ADC 112. The DAC 114 provides an output voltage 130 to the differencing circuitry 116.

The differencing circuitry 116 computes the difference of the voltage on the sampling capacitor 110 and the output voltage 130 provided by the DAC 114 to produce a residue voltage 138. The differencing circuitry 116 provides the residue voltage 138 to the residue amplifier 118. The residue amplifier 118 amplifies the residue voltage 138 for digitization by a next stage of the pipelined ADC 102.

The flash ADC 112 is coupled to, and provides the comparator output signals 134 to, the error correction circuitry 122 via the flip-flops 120. The flip-flops 120 are disposed proximate the error correction circuitry 122 at the boundary of the digital circuitry of the error correction circuitry 122 and the analog circuitry of the conversion stage 105. The flip-flops 120 include a plurality of flip-flops 121. Each flip-flop 121 includes an input terminal 121D that is coupled to an output of the one of the comparators of the flash ADC 112, and an output terminal 121Q that is coupled to the error correction circuitry 122.

The error correction circuitry 122 combines the output 136 of the flip-flops 120, which is the stored output of the flash ADC 112, with the output values produced by other stages of the pipelined ADC 102 to generate a digital output 124 representative of the voltage on the sampling capacitor 110.

Figure 2:
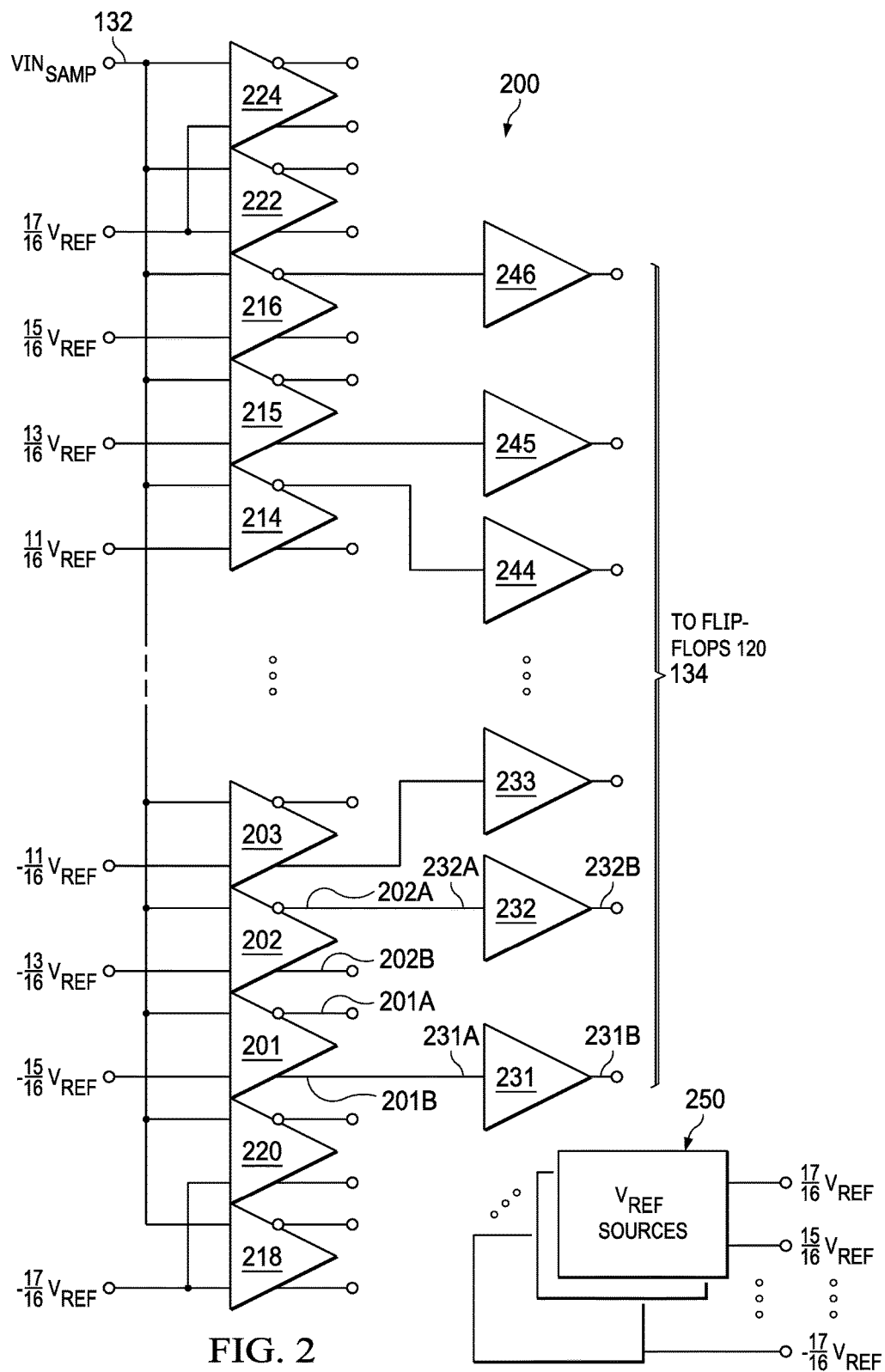
FIG. 2 shows a block diagram for an example flash ADC included in a pipelined ADC in accordance with the present disclosure.

FIG. 2 shows a block diagram for an example flash ADC 200 in accordance with the present disclosure. The flash ADC 200 is an implementation of the flash ADC 112. The flash ADC 200 includes a plurality of latched comparators and a plurality of driver circuits coupled to the latched comparators. Some implementations of the flash ADC 200 include circuitry that has been omitted from FIG. 2 in the interest of clarity. For example, an implementation of the flash ADC 200 includes dithering circuitry that adds slight randomization to the latched comparators 201-216.

The flash ADC 200 includes a plurality of latched comparators 201-216 that compare the voltage on the sampling capacitor 110 to different reference voltages. While the flash ADC 200 as illustrated in FIG. 2 includes sixteen latched comparators, implementations of the flash ADC 200 include any number of latched comparators for comparing the voltage on the sampling capacitor 110 to different threshold voltages. Each of the latched comparators 201-216 includes an input terminal coupled to the sampling capacitor 110, a non-inverting output terminal and an inverting output terminal. Latched comparators 201 and 202 are representative and respectively include inverting outputs 201A and 202A, and non-inverting outputs 201B and 202B. Each of the latched comparators 201-216 also includes an input terminal coupled to one of a plurality of reference voltage sources 250. Each reference voltage source 250 provides a threshold voltage to the corresponding comparator. For example, a first reference voltage source 250 provides a threshold voltage that is 15/16 of a reference voltage to the latched comparator 216, a second reference voltage source 250 provides a threshold voltage that is 13/16 of a reference voltage to the latched comparator 215, a third reference voltage source 250 provides a threshold voltage that is 11/16 of a reference voltage to the latched comparator 214. Similarly, a fourth reference voltage source 250 provides a threshold voltage that is −11/16 of a reference voltage to the latched comparator 203, a fifth reference voltage source 250 provides a threshold voltage that is −13/16 of a reference voltage to the latched comparator 202, a sixth reference voltage source 250 provides a threshold voltage that is −15/16 of a reference voltage to the latched comparator 201, etc.

Figure 3:
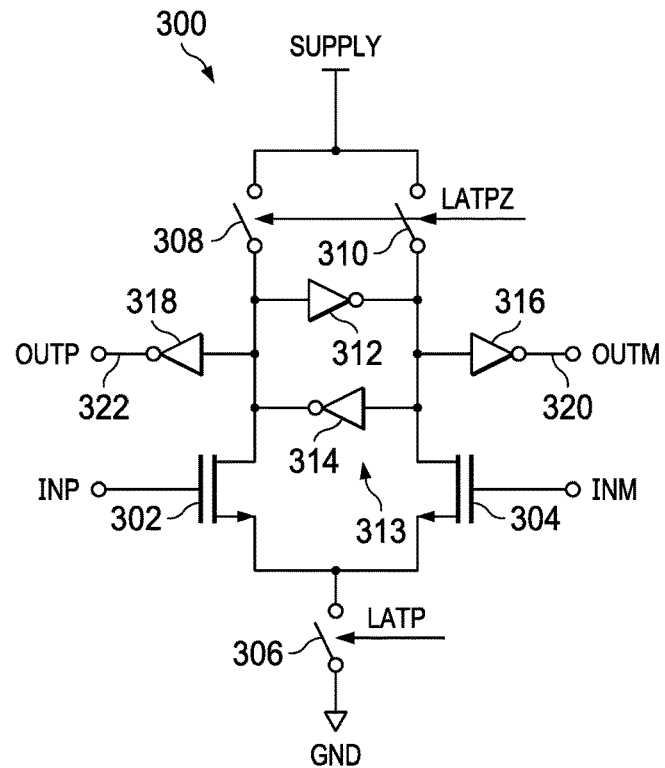
FIG. 3 shows a schematic diagram for an example latched comparator suitable for use in a flash ADC in accordance with the present disclosure.

FIG. 3 shows a schematic diagram for an example latched comparator 300. The latched comparator 300 is an implementation of each of the latched comparators 201-216. The latched comparator 300 includes a transistor 302, a transistor 304, a switch 306, a switch 308, a switch 310, an inverter 312, an inverter 314, and inverter 316, and an inverter 318. The inverter 312 and the inverter 314 are cross-coupled to form a latch 313. The switch 308 and the switch 310 are closed to reset the latch 313 and force the output 320 and the output 322 to zero. The switch 306 is closed, and the switch 308 and the switch 310 opened, to allow the latched comparator 300 to compare an input voltage to a threshold voltage. For example, the sampling capacitor 110 is coupled to the transistor 302 and a threshold voltage (e.g., generated by one of the 250) provided to the transistor 304. Operation of the transistor 302 and the transistor 304 cause the latch 313 to switch to a state corresponding to the higher of the voltages at the gates of the transistor 302 and the transistor 304. The signal LATPZ that controls the switch 308 and the switch 310 is an inverted version of the signal LATP that controls the switch 306. Operational current increases in the latched comparator 300 as the difference between the voltages being compared decreases. Thus, in the flash ADC 200, the current drawn by each latched comparator 201-216 increases as the voltage on the sampling capacitor 110 approaches the threshold voltage provided to the latched comparator.

Figure 4:
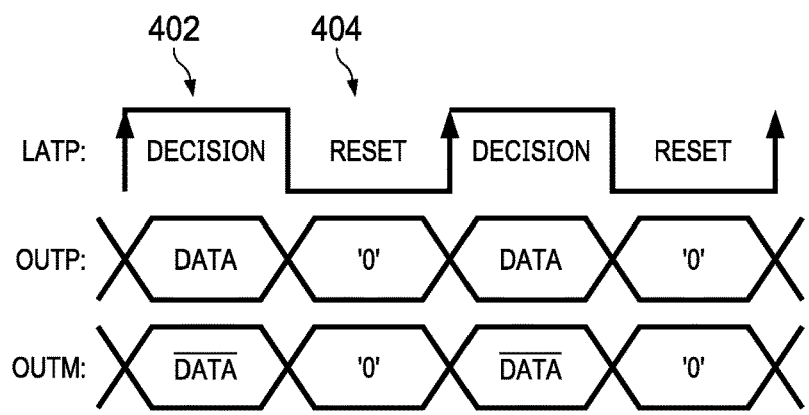
FIG. 4 shows a timing diagram that illustrates operation of a latched comparator in a flash ADC in accordance with the present disclosure.

FIG. 4 illustrates operation of the latched comparator 300. When LATP is active, in interval 402, the switch 308 and the switch 310 are open, and the switch 306 is closed. The latched comparator 300 compares the voltage at the gate of the transistor 302 and the gate of the transistor 304, and the output 322 and the output 320 are set based on the comparison. When LATP is inactive, in interval 404, the switch 308 and the switch 310 are closed, and the switch 306 is open, and the output 322 and the output 320 are set to zero.

Returning now to FIG. 2, the flash ADC 200 includes a plurality of driver circuits 231-246. Each of the driver circuits 231-246 is coupled to one of the latched comparators 201-216 and drives the output signal of the comparator, which includes transitions due to comparison in the interval 402 and latch resetting in the interval 404, to the flip-flops 120. In some flash ADC implementations, the outputs of the comparators are clocked into flip-flops and driver circuits then drive the outputs of the flip-flops to the error correction circuit. In such implementations, the current drawn by the flip-flops and the driver circuits is dependent on the signal being digitized.

Figure 5:
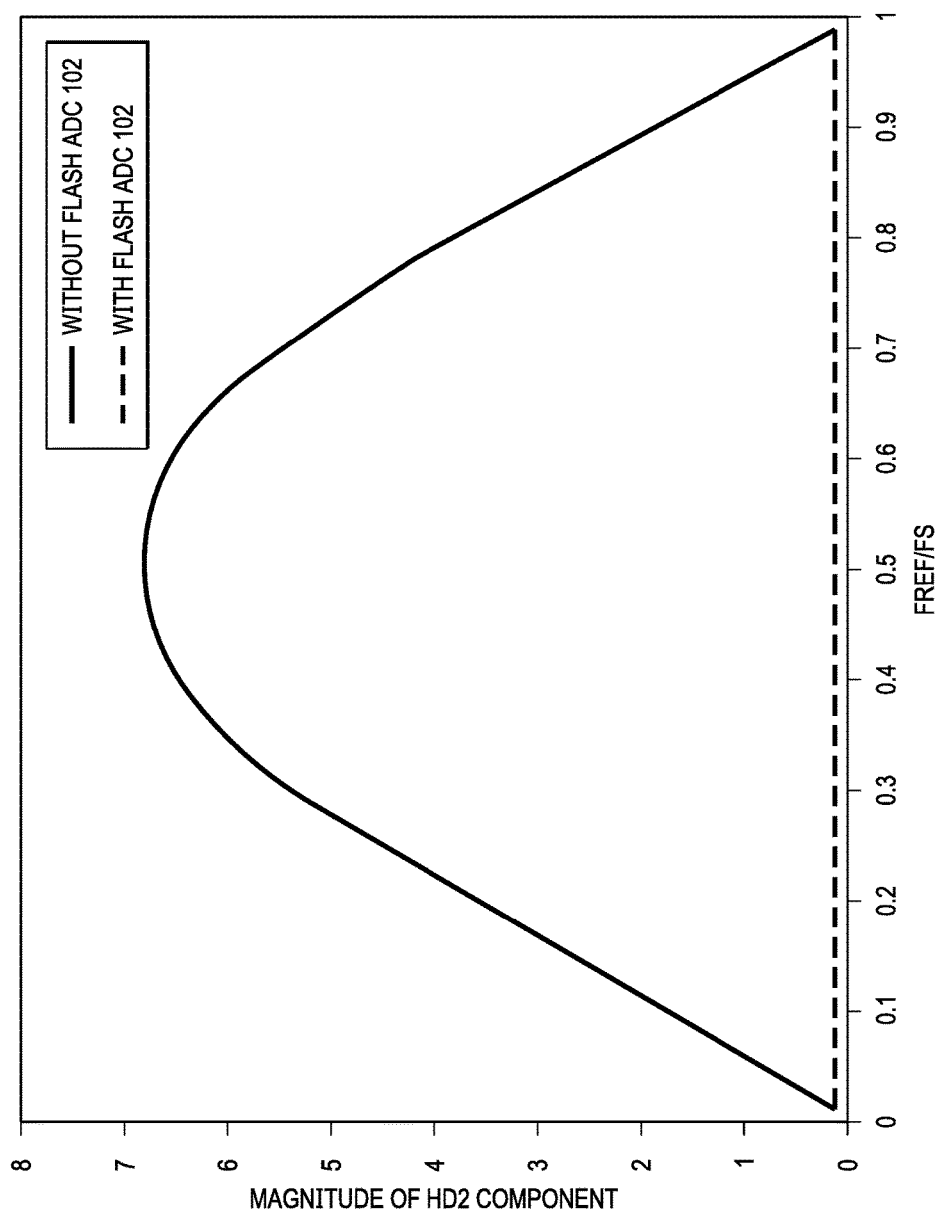
FIG. 5 shows a graph comparing the second harmonic distortion component in total supply current drawn by driver circuits and flip-flops in systems with and without the pipelined ADC of the present disclosure.

Each of the driver circuits 213-246 includes an input terminal and an output terminal. Driver circuits 231 and 323 are representative and include input terminals 231A and 232A, and output terminals 231B and 232B respectively. As viewed in order of increasing threshold voltage, the driver circuits 231-246 are alternately coupled to inverting or non-inverting outputs of the latched comparators 201-216. For example, input terminal 231A of the driver circuit 231 is coupled to the non-inverting output 201B of the latched comparator 201, input terminal 232A of the driver circuit 232 is coupled to the inverting output 202A of the latched comparator 202, driver circuit 233 is coupled to the non-inverting output of the latched comparator 203, driver circuit 244 is coupled to the non-inverting output of the latched comparator 214, driver circuit 245 is coupled to the inverting output of the latched comparator 215, driver circuit 246 is coupled to the non-inverting output of the latched comparator 216, etc. Driving the alternate polarity outputs of the latched comparators 201-216 to the flip-flops 120, which are located at the boundary of the digital circuitry of the system 100, reduces the influence of the input signal 106 on the current drawn by the flash ADC 200, thereby reducing the harmonics generated in the current by operation of the flash ADC 200. FIG. 5 shows second harmonic distortion versus input frequency ("fref" refers to input frequency and "fs" refers to sampling frequency) in the current drawn by the flash ADC 200 to that of a flash ADC using conventional transmission circuitry. FIG. 5 shows that the second harmonic content of the current drawn by the flash ADC 200 is relatively low and constant compared to the second harmonic content of current drawn by a flash ADC that lacks transmission circuitry arranged as disclosed herein.

Returning again to FIG. 2, in order to reduce variance in the average current drawn by the flash ADC 200 with input signal amplitude, the flash ADC 200 includes additional latched comparators that apply threshold voltages outside the conversion range of the flash ADC 200. The implementation of FIG. 2 includes a latched comparator 218, a latched comparator 220, a latched comparator 222, and a latched comparator 224. The threshold voltages provided to the latched comparators 218-224 is outside the range of the threshold voltages applied to select a digital value corresponding to the sample voltage 132. A first threshold voltage is provided to the latched comparator 218 and the latched comparator 220, and a second threshold voltage is provided to the latched comparator 222 and the latched comparator 224. The first threshold voltage is lower than the lowest threshold voltage provided to the latched comparators 201-216 (i.e., lower than a lower limit of voltage digitizable by the flash ADC 200), and the second threshold voltage is higher than the highest threshold voltage provided to the 201-216 (i.e., higher than an upper limit of voltage digitizable by the flash ADC 200). For example, in the flash ADC 200 as illustrated in FIG. 2, −17/16V of the reference voltage is provided to the latched comparator 218 and the latched comparator 220, and 17/16V of the reference voltage is provided to the latched comparator 222 and the latched comparator 224. Other implementations of the flash ADC 200 include a different number of additional latched comparators and/or provide different reference voltages to the additional latched comparators. The current drawn by the additional latched comparators 218-224 reduces variance in the current drawn by the flash ADC 200 at higher signal amplitudes which substantially reduces the harmonics induced in the current drawn by the flash ADC 200 relative to other implementations.

Figure 6:
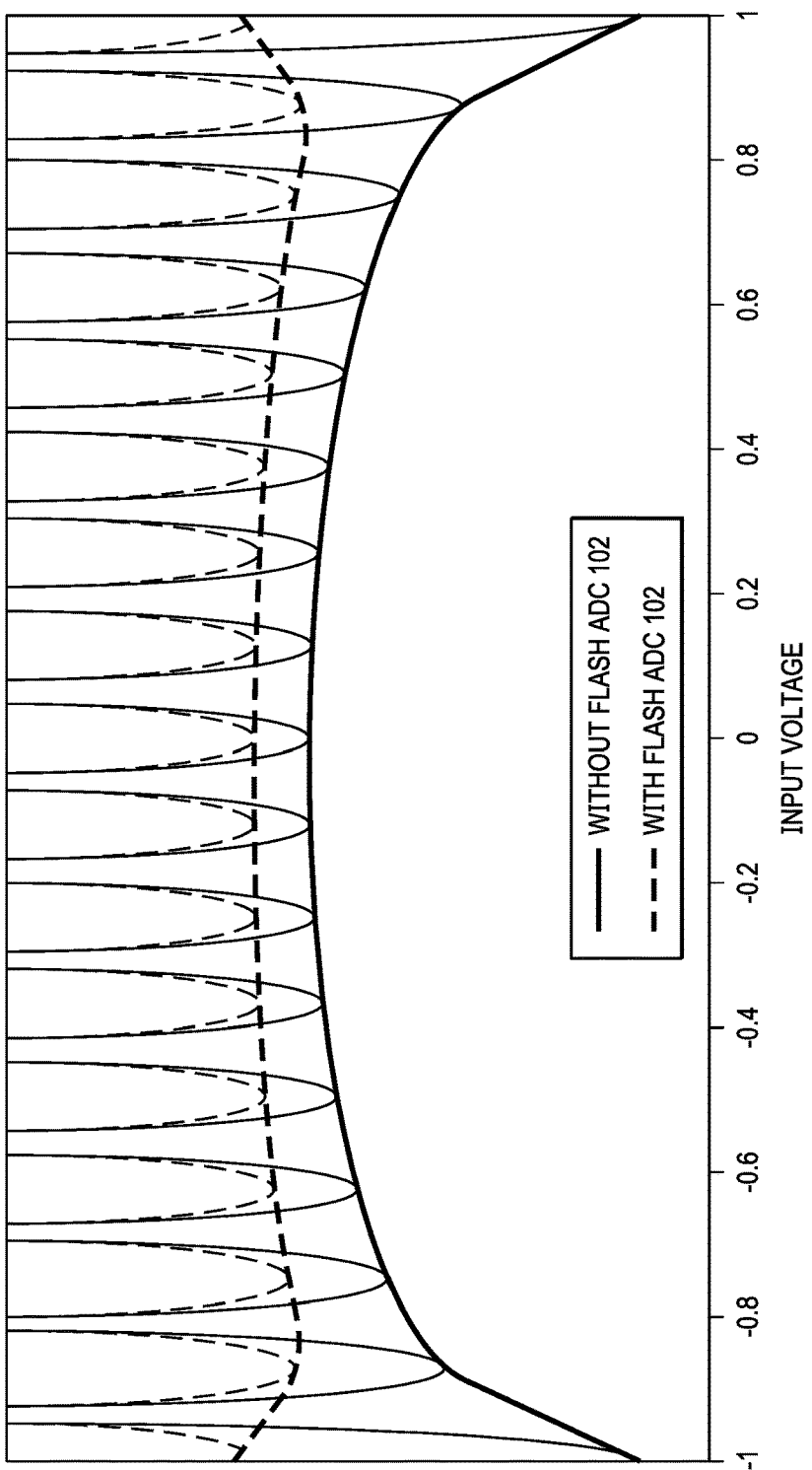
FIG. 6 shows a graph comparing the total average current drawn by all comparators versus input voltage with and without the additional comparators of the present disclosure.

FIG. 6 shows a graph comparing the current profile of the flash ADC 200 and a flash ADC that lacks the additional comparators of the flash ADC 200. FIG. 6 shows that the range of current drawn by the flash ADC 200 is substantially lower than the range of current drawn by a flash ADC that lacks the additional latched comparators 218-224. Thus, the even harmonics induced by the flash ADC 200 are substantially lower than those generated by a flash ADC that lacks the additional latched comparators 218-224.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A pipelined analog-to-digital converter (ADC), comprising:
   a flash ADC, comprising:
      a plurality of latched comparators, each of the latched comparators comprising:
         an inverting output; and
         a non-inverting output;
      a plurality of driver circuits, each of the driver circuits coupled to one of the latched comparators, and comprising:
         an input terminal; and
         an output terminal;
      wherein:
         in a first subset of the driver circuits the input terminal is coupled to the inverting output of one of the latched comparators; and
         in a second subset of the driver circuits the input terminal is coupled to the non-inverting output of one of the latched comparators;
      and
   error correction circuitry coupled to the flash ADC.

2. The pipelined ADC of claim 1, further comprising a plurality of flip-flops, each of the flip-flops comprising:
   a data input terminal coupled to the output terminal of one of the driver circuits; and
   an output terminal coupled to the error correction circuitry.

3. The pipelined ADC of claim 2, wherein the flip-flops are disposed on an integrated circuit with the error correction circuitry, and at a boundary of the error correction circuitry.

4. The pipelined ADC of claim 1, further comprising a plurality of reference voltage sources each of the reference voltage sources configured to generate a different threshold voltage and provide the threshold voltage to one of the latched comparators; wherein in sequence of highest to lowest threshold voltage, each successive one of the latched comparators is configured to provide an output signal to a different one of the first subset of the driver circuits and the second subset of the driver circuits.

5. The pipelined ADC of claim 4, wherein the plurality of latched comparators is a first plurality of latched comparators, and the pipelined ADC further comprises a second plurality of latched comparators, wherein each of the latched comparators of the second plurality of latched comparators is coupled to a reference voltage source configured to provide a threshold voltage that is greater than a highest voltage resolvable by the FLASH ADC.

6. The pipelined ADC of claim 5, wherein each of the latched comparators of the second plurality of latched comparators is coupled to a same reference voltage source.

7. The pipelined ADC of claim 5, further comprising a third plurality of latched comparators, wherein each of the latched comparators of the third plurality of latched comparators is coupled to a threshold voltage source configured to provide a threshold voltage that is lower than a lowest voltage resolvable by the FLASH ADC.

8. The pipelined ADC of claim 7, wherein each of the latched comparators of the third plurality of latched comparators is coupled to a same threshold voltage source.

9. A system, comprising:
   front end circuitry;
   a sampling switch coupled to the front end circuitry;
   a sampling capacitor coupled to the sampling switch;
   a flash analog-to-digital converter (ADC) coupled to the sampling capacitor, and comprising:
      a first plurality of latched comparators each configured to compare a voltage on the sampling capacitor to a threshold voltage that is within a range of voltage digitizable by the flash ADC;
      a second plurality of latched comparators each configured to compare the voltage on the sampling capacitor to a threshold voltage that is higher than an upper limit of voltage digitizable by the flash ADC;
   a digital-to-analog converter (DAC) coupled to the flash ADC, and configured to generate a voltage representative of output of the first plurality of latched comparators; and
   a residue amplifier coupled to the sampling capacitor and the DAC, and configured to generate a residue voltage that is a difference of the voltage on the sampling capacitor and the voltage representative of output of the first plurality of latched comparators.

10. The system of claim 9, wherein each latched comparator of the second of plurality of latched comparators is configured to compare the voltage on the sampling capacitor to a same threshold voltage.

11. The system of claim 9, wherein the flash ADC further comprises a third plurality of latched comparators each configured to compare the voltage on the sampling capacitor to a threshold voltage that is lower than a lower limit of voltage digitizable by the flash ADC.

12. The system of claim 11, wherein each latched comparator of the third plurality of latched comparators is configured to compare the voltage on the sampling capacitor to a same threshold voltage.

13. The system of claim 9, wherein the flash ADC further comprises:
   a first plurality of driver circuits, each driver circuit of the first plurality of driver circuits coupled to an inverting output of one of the latched comparators of the first plurality of latched comparators;

a second plurality of driver circuits, each driver circuit of the second plurality of driver circuits coupled to a non-inverting output of one of the latched comparators of the first plurality of latched comparators; and a plurality of reference voltage sources each of the reference voltage sources configured to generate a different threshold voltage and provide the threshold voltage to one of the latched comparators of the first plurality of latched comparators; wherein in sequence of highest to lowest threshold voltage, each successive one of the latched comparators of the first plurality of latched comparators is configured to provide an output signal to a different one of the first subset of the driver circuits and the second subset of the driver circuits.

14. The system of claim 13, further comprising a plurality of flip-flops configured to latch signal received from the first plurality of driver circuits and the second plurality of driver circuits.

15. The system of claim 14, further comprising error correction circuitry coupled to outputs of the flip-flops, and configured to generate a digital value representing the voltage on the capacitor based on signals received from the flip-flops.

16. A pipelined analog-to-digital converter (ADC), comprising:

a flash ADC, comprising:

a plurality of reference voltage sources each configured to generate a different threshold voltage;

a plurality of latched comparators each configured to compare a sample voltage to a threshold voltage provided by one of the reference voltage sources; wherein the threshold voltage provided to each of the latched comparators is different, and is within a range of voltage digitizable by the flash ADC;

a first plurality of driver circuits, each driver circuit of the first plurality of driver circuits coupled to an inverting output of one of the latched comparators; and a second plurality of driver circuits, each driver circuit of the second plurality of driver circuits coupled to a non-inverting output of one of the latched comparators;

wherein in sequence of highest to lowest threshold voltage, each successive one of the latched comparators is configured to provide an output signal to a different one of the first subset of the driver circuits and the second subset of the driver circuits;

a plurality of flip-flops coupled to the flash ADC, and configured to store signal values received from the first plurality of driver circuits and the second plurality of driver circuits; and error correction circuitry coupled to outputs of the flip-flops, and configured to generate a digital value representing the sample voltage based on signals received from the flip-flops.

17. The pipelined ADC of claim 16, wherein the plurality of latched comparators is a first plurality of latched comparators, and the flash ADC further comprises a second plurality of latched comparators each configured to compare the sample voltage to a threshold voltage that is higher than an upper limit of voltage digitizable by the flash ADC.

18. The pipelined ADC of claim 17, wherein each latched comparator of the second plurality of latched comparators is configured to compare the sample voltage to a same threshold voltage.

19. The pipelined ADC of claim 17, wherein the flash ADC further comprises a third plurality of latched comparators each configured to compare the sample voltage to a threshold voltage that is lower than a lower limit of voltage digitizable by the flash ADC.

20. The pipelined ADC of claim 19, wherein each latched comparator of the third plurality of latched comparators is configured to compare the sample voltage to a same threshold voltage.

* * * * *